(12) United States Patent
Fish et al.

(10) Patent No.: US 8,358,897 B1
(45) Date of Patent: Jan. 22, 2013

(54) HIGH INDEX BONDING LAYER FOR HYBRID PHOTONIC DEVICES

(75) Inventors: Gregory Alan Fish, Santa Barbara, CA (US); Matthew Jacob-Mitos, Goleta, CA (US)

(73) Assignee: Aurrion, LLC, Goleta, CA (US)

( * ) Notice: Subject to any disclaimer, the term of this patent is extended or adjusted under 35 U.S.C. 154(b) by 0 days.

(21) Appl. No.: 13/450,332

(22) Filed: Apr. 18, 2012

Related U.S. Application Data

(63) Continuation of application No. 12/964,993, filed on Dec. 10, 2010, now abandoned.

(51) Int. Cl.
*G02B 6/10* (2006.01)
*G02B 6/00* (2006.01)
(52) U.S. Cl. .............................. 385/131; 385/14; 385/40
(58) Field of Classification Search .................. None
See application file for complete search history.

(56) References Cited

U.S. PATENT DOCUMENTS

| | | | |
|---|---|---|---|
| 7,187,837 B2* | 3/2007 | Gothoskar et al. | 385/131 |
| 7,447,395 B2* | 11/2008 | Montgomery et al. | 385/14 |
| 2008/0212913 A1* | 9/2008 | Gill et al. | 385/2 |
| 2009/0074368 A1* | 3/2009 | Santori et al. | 385/130 |
| 2010/0111128 A1* | 5/2010 | Qin et al. | 372/46.01 |

* cited by examiner

*Primary Examiner* — Tina Wong
(74) *Attorney, Agent, or Firm* — Blakely, Sokoloff, Taylor & Zafman, LLP

(57) ABSTRACT

Embodiments of the invention are hybrid photonic devices including a first semiconductor slab (i.e. region) comprising a silicon material and a second semiconductor slab, comprising a III-V material, above and partially overlapping the first semiconductor slab to create a lateral overlap region. A bonding layer may be formed on the second semiconductor slab to enable the bonding of the first and second semiconductor slabs at the lateral overlap region. An optical waveguide is formed to be included in the lateral overlap region and comprising the silicon semiconductor material, the III-V semiconductor material and the bonding layer. Thus, in embodiments of the invention the bonding layer comprises a material with a refractive index of at least 2.0 so as to not affect the optical mode shape or propagation loss of the hybrid electro-optical device.

18 Claims, 4 Drawing Sheets

HIGH INDEX BONDING LAYER FOR HYBRID PHOTONIC DEVICES

This application is a continuation of U.S. patent application Ser. No. 12/964,993 filed Dec. 10, 2010 now abandoned and claims priority thereto.

FIELD

Embodiments of the invention generally pertain to photonic devices, and more particularly to bonding layers for hybrid photonic devices that comprise silicon and III-V semiconductor material.

BACKGROUND

The efficiency of an optical device (e.g., the aspects of the drive voltage or power requirement of the device) is fundamentally determined by the electro-optic materials used to construct the device.

Silicon materials are more easily processed and more readily available, but are not as efficient at light emission or absorption as III-V materials. Attempts have been made to create photonic devices utilizing both materials; however, most of these attempts have been limited in that the active electro-optic components of the device are included solely in the III-V material, while silicon material is used solely for passive optical waveguiding and/or driving circuitry.

Optical devices have been formed by bonding a wafer of III-V material as an active region to silicon and removing the substrate using standard photolithographic techniques on the silicon substrate. The coupling of III-V and silicon regions allows for the integration of highly efficient optical devices included in the III-V region with high speed silicon integrated circuits.

Prior art methods to bond III-V and silicon regions include using spin-on glass or polymer based bonding, oxides and metals; however, these solutions are only suitable for optical devices wherein optical functionality is confined to the III-V region of the device.

For hybrid III-V/silicon optical devices wherein optical functionality occurs within both the silicon and III-V regions, these prior art bonding layers are not suitable as they adversely affect the optical mode shape and propagation loss of the device. For these hybrid devices, what is needed is a more optically compliant layer that improves the bonding between the III-V and silicon regions.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
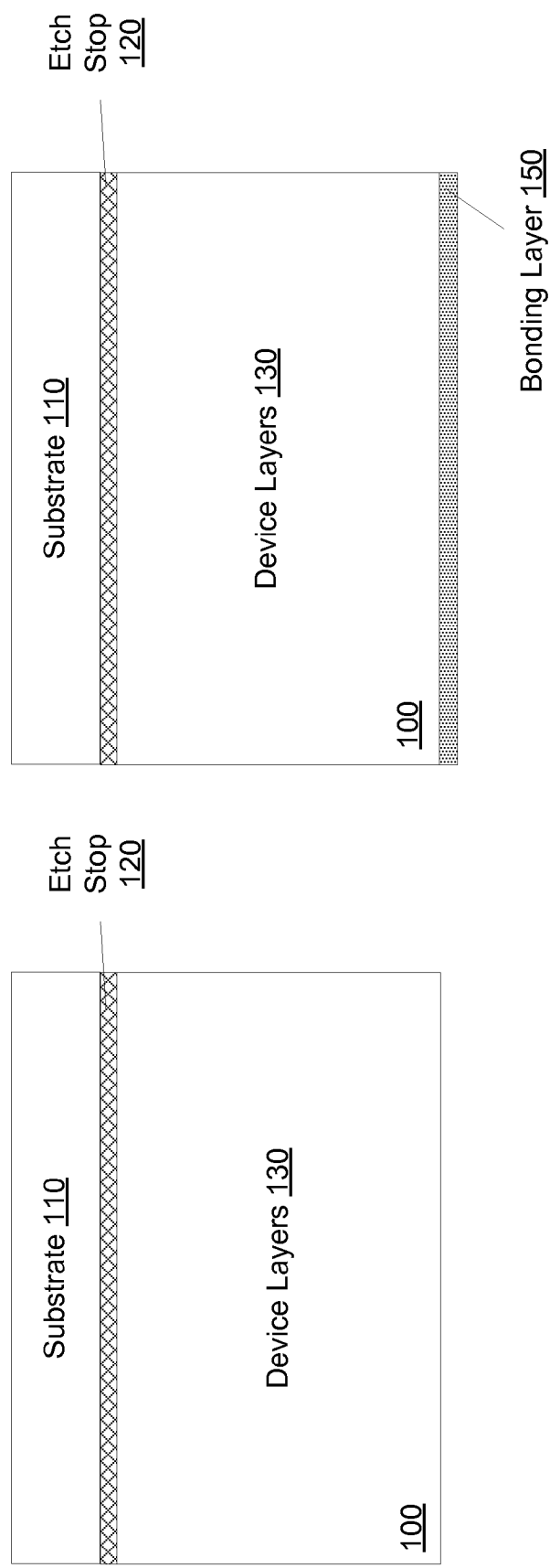
FIG. 1 illustrates diagrammatic, cross-sectional views of stages of an example embodiment process for forming a bonding layer for a hybrid photonic device.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the present invention relate to bonding layers for hybrid electro-optic devices that comprise a first region of silicon semiconductor material and a second region of III-V semiconductor material. Embodiments of the invention may include a first semiconductor slab (i.e. region) comprising a silicon material and a second semiconductor slab, comprising a III-V material, above and partially overlapping the first semiconductor slab to create a lateral overlap region. A bonding layer may be formed on the second semiconductor slab to enable the bonding of the first and second semiconductor slabs at the lateral overlap region. An optical waveguide is formed and included in the lateral overlap region; this waveguide comprises the silicon semiconductor material, the III-V semiconductor material and the bonding layer. Thus, in embodiments of the invention the bonding layer comprises a material with a refractive index of at least 2.0 so as to not affect the optical mode shape or propagation loss of the hybrid electro-optical device.

III-V semiconductors have elements that are found in group III and group V of the periodic table (e.g., Indium Gallium Arsenide Phosphide (InGaAsP), Gallium Indium Arsenide Nitride (GaInAsN), Gallium Arsenide (GaAs)). The carrier dispersion effects of III-V based materials may be significantly higher than in silicon based materials for bandgaps closer to the wavelength of the light, as electron speed in III-V semiconductors is much faster than that in silicon. Thus, III-V semiconductor materials enable photonic operation with an increased efficiency at generating light from electricity and converting light back into electricity.

"Hybrid photonic devices," as referred to herein, describe devices wherein the optical portion—i.e., the optical mode, comprises both the silicon and III-V semiconductor regions, and thus the refractive index of the semiconductor materials and the refractive index of the bonding layer directly effects the optical function of the device.

Bonding layers utilized in the prior art for III-V and silicon semiconductor regions include spin-on polymer or glass layers. These layers, while capable of mechanically bonding the two semiconductor regions, are made of materials that adversely affect the function of hybrid photonic devices or have a thickness that prevents optical interaction between both the silicon and III-V semiconductor regions.

Embodiments of the invention utilize a semiconductor bonding layer that enables the bonding of III-V semiconductor region to a silicon semiconductor region of a hybrid photonic device. This bonding layer may comprise a high refractive index (i.e., a refractive index of at least 2.0), low modulus material that does not affect the optical mode shape or propagation loss of the hybrid optical device.

FIG. 1 illustrates diagrammatic, cross-sectional views of stages of an example embodiment process for forming a bonding layer for a hybrid photonic device. In this embodiment, III-V semiconductor region 100 includes substrate layer 110, etch stop 120, and device layers 130. These layers of III-V semiconductor region 100 may be of any materials suitable for optic devices—for example, in one embodiment, substrate layer 110 comprises a semi-insulating (SI) GaAs substrate layer, device layer 130 comprises GaAs, and etch stop layer 120 comprises Indium Gallium Phosphide (InGaP), Aluminum Gallium Arsenide (AlGaAs), Aluminum Arsenide (AlAs) or any functionally equivalent material that is not etched by the etchants that remove GaAs.

It is understood that GaAs, and the materials that can be epitaxially grown on it are effective III-V materials to use for photonic devices, particularly high power photonic devices, at least because of the material's thermal efficiency, high saturated electron velocity, high electron mobility, high breakdown voltage, higher gain, lower temperature sensitivity and lower optical loss and Auger recombination.

It is to be understood that III-V semiconductor region 100 is to be bonded with a corresponding silicon semiconductor region (which will also contain device layers) to form a hybrid photonic device. It is known that certain optical materials do not bond natively to silicon substrates. For example GaAs alone does not effectively bond directly to silicon using oxygen plasma bonding processes known in the art.

Bonding layer 150 may be formed to enable effective bonding of III-V semiconductor region 100 to a corresponding silicon semiconductor region. Bonding layer 150 may comprise a high refractive index (i.e., a refractive index greater than 2.0), low modulus material that will not affect the optical mode shape or propagation loss of the resulting hybrid optical device. For hybrid photonic devices including GaAs based materials, bonding layer 150 may contain indium to improve the ability to wafer bond GaAs based materials to silicon substrates. For the example embodiment described above (i.e., wherein III-V semiconductor region 100 includes GaAs based materials) bonding layer 150 may comprise InGaP (e.g., $In_{0.49}Ga_{0.51}P$) or InGaAsP which is overlaid on III-V semiconductor region 100. It is to be understood that bonding layer 150 may be relatively thin (e.g., less than 200 nm) and still be suitable for bonding purposes.

The III-V region, including the bonding layer, and the silicon region may be subjected to an oxygen plasma to grow oxide layers on each region. The regions may then be bonded at their oxide layers.

Figure 2:
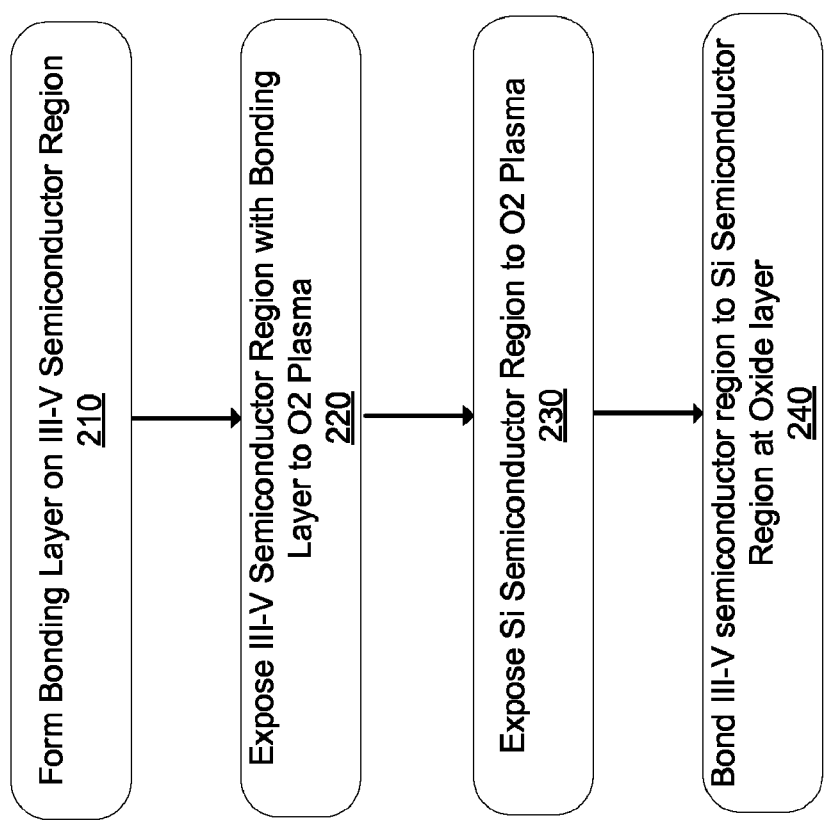
FIG. 2 is a flow diagram illustrating a process to bond a III-V semiconductor region to a silicon semiconductor region according to an embodiment of the invention.

FIG. 2 is a flow diagram illustrating a process to bond a III-V semiconductor region to a silicon semiconductor region according to an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

A bonding layer may be formed on a III-V semiconductor region, 210. In one embodiment, the bonding layer is formed epitaxially—i.e., deposited and grown on the III-V semiconductor region.

Prior to device layer processing to form the III-V portions of the resulting hybrid photonic device, the bonding layer is exposed to oxygen plasma, 220, to form an oxide layer on the III-V semiconductor region. This operation may comprise any oxide formation process known in the art.

The silicon semiconductor region including silicon portions of the resulting hybrid photonic device is similarly exposed to oxygen plasma, 230, to form an oxide layer on the silicon semiconductor region.

The III-V and silicon semiconductor regions are thus bonded at their respective oxide layers, 240. It is to be understood that these respective oxide layers are too thin to interfere with the optical interaction between the III-V and silicon semiconductor regions.

Figure 3:
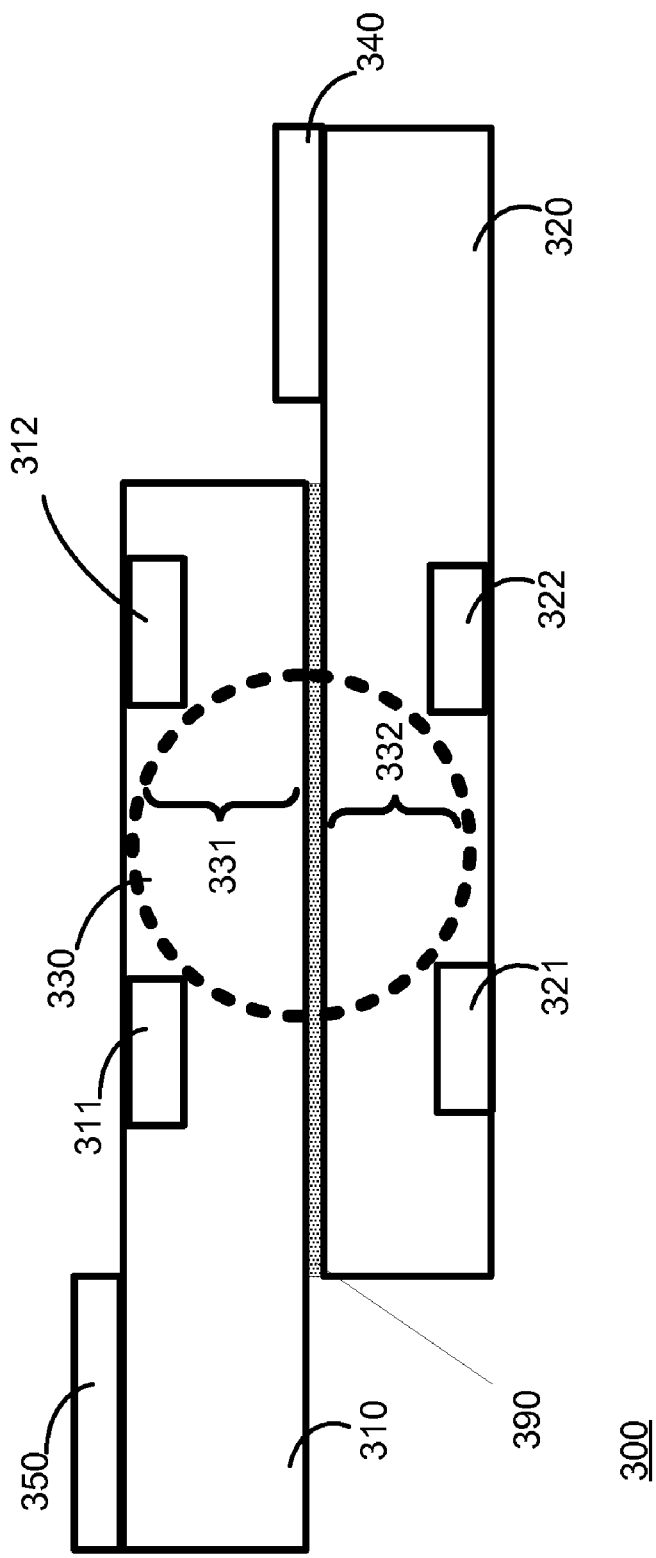
FIG. 3 is block diagram of a hybrid III-V silicon photonic device.

FIG. 3 is block diagram of a hybrid III-V silicon photonic device. It is to be understood that there exist various processing techniques that may be used to form the device as shown. Accordingly, the inventive structure may be formed using any acceptable process sequence that yields the various device elements, element positions and associated doping levels required for acceptable operation.

Device 300 includes silicon semiconductor region 320 and overlapping III-V semiconductor region 310. Within the lateral overlapped region is optical waveguide 330, which includes both the silicon and III-V semiconductor material as illustrated by upper section 331 (comprising the III-V material) and lower section 332 (comprising the silicon material). The circular shape of optical waveguide 330 in FIG. 3 is for illustrative purposes only. It will be understood that the shape and size of the optical waveguide is the result of optical confinement properties of regions 310 and 320.

In the illustrated embodiment, optical confinement of optical waveguide 330 is created by physical aspects of III-V semiconductor region 310 and silicon semiconductor region 320. In this embodiment, the vertical confinement of optical waveguide 330 is the result of the height of regions 310 and 320. The horizontal confinement is the result of confinement regions 311 and 312 included in region 310, and confinement regions 321 and 322 included in region 320. In this embodiment, said confinement regions are insulating regions. In other embodiments, said confinement regions may be of any material with a lower refractive index than waveguide 330, and may result from etching and re-growth or oxidation or other suitable techniques.

Device 300 further includes bonding layer 390, which may comprise any bonding material as described above (i.e., having a refractive index greater than 2.0) and be formed by any process described above. Furthermore, in this embodiment bonding layer 390 is less than 200 nm thick. Thus, the bonding layer causes no optical confinement or effect on the optical mode of the device due to the material properties and physical dimensions of the layer.

Device 300 further includes electrode 340 coupled to silicon semiconductor region 320, and electrode 350 coupled to III-V semiconductor region 310. The (real and imaginary) refractive index of at least one of waveguide section 331 and 332 may change based on an electrical difference applied to electrodes 340 and 350. Said changes to the refractive index (or indexes) are proportional to the strength of the electrical difference applied to electrodes 340 and 350.

The electrical difference applied to electrodes 340 and 350 may be an electrical voltage or an electrical field. The photonic and electronic interaction of regions 310 and 320, which is not limited by bonding layer 350, during application of said electrical difference will cause device 300 to amplify, modulate or detect light transmitted through optical waveguide 300 (i.e., to either forward bias (i.e., for amplification) or reverse bias (i.e., for modulation or detection) the structure). The complex refractive index (i.e., at least one of the real and the imaginary refractive index) of at least the portion of active region included in optical mode 330 changes based on an electrical difference applied to electrodes 340 and 350. These changes to the refractive index (or indexes) are proportional to the strength of the electrical difference applied to electrodes 340 and 350.

Figure 4:
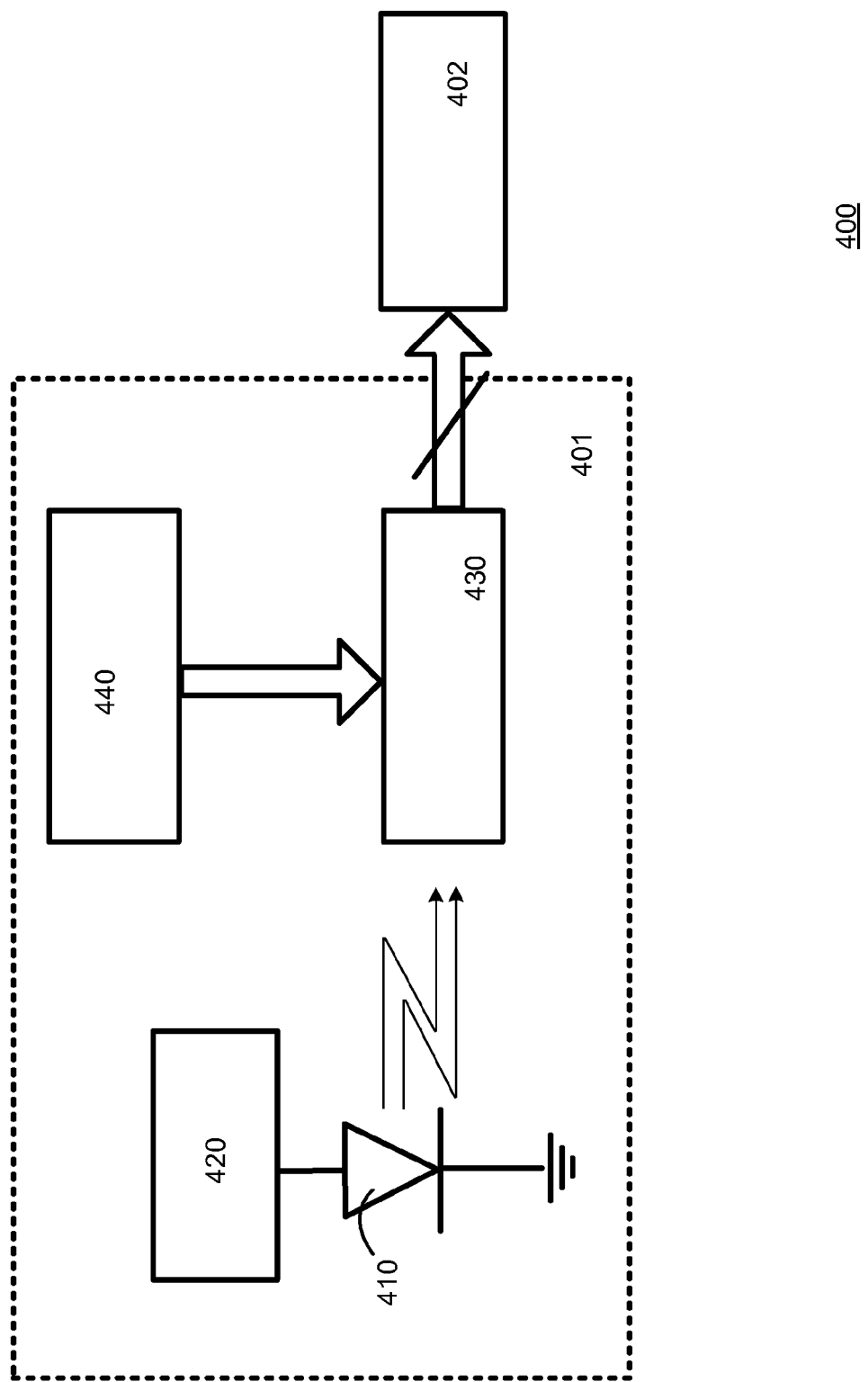
FIG. 4 is a block diagram of a simplified optical system utilizing an embodiment of the invention.

FIG. 4 is a block diagram of a simplified optical system utilizing an embodiment of the invention. System 400 includes transmitter 401 and receiver 402. Transmitter 401 includes light source 410 and light source controller 420. In the illustrated embodiment, light source 420 is a laser utilizing a hybrid active gain structure, wherein the structure comprises any embodiment of the invention described above. Light source controller 420 may control the hybrid active gain structure of light source 410 (i.e., light source controller 420 may create an electrical difference at electrical contacts of light source 410). In one embodiment, light source controller 420 comprises silicon circuitry while light source 410 comprises III-V and silicon semiconductor material. Light source 410 may transmit optical signals to modulator 430 via any transmission medium known in the art.

The structure of modulator 430 may comprise any embodiment of the invention described above. Modulator 430 may perform either amplitude or phase modulation of the light received from light source 410. In one embodiment, optical waveguides of modulator 430 are controlled by modulator controller 440 (i.e., modulator controller 440 may create an electrical difference at electrical contacts of modulator 430). The modulated output of modulator 630 may be transmitted to receiver 402 via any transmission medium known in the art. Receiver 602 may include an optical device wherein the structure of said device comprises any embodiment of the invention described above.

In one embodiment, system 400 is included in a single device or chip, wherein silicon components of system 400 are included on a silicon portion of the chip, and III-V semiconductor components of system 400 are included on a III-V portion of the chip. These portions may be fabricated independently and subsequently bonded via any bonding process described above using any bonding layer described above.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An apparatus comprising:
   a first semiconductor slab comprising a silicon material;
   a second semiconductor slab comprising a III-V material, above and partially overlapping the first semiconductor slab to create a lateral overlap region;
   a bonding layer formed on the second semiconductor slab to enable the second semiconductor slab to be bonded to the first semiconductor slab at the lateral overlap region; and
   an optical waveguide included in the lateral overlap region and comprising the silicon semiconductor material, the III-V semiconductor material and the bonding layer, the bonding layer comprising a material with a refractive index of at least 2.0.

2. The apparatus of claim 1, wherein the bonding layer is further comprises a material epitaxially deposited on the second semiconductor slab.

3. The apparatus of claim 1, wherein the III-V material comprises Gallium Arsenide (GaAs).

4. The apparatus of claim 3, wherein the bonding layer comprises a material including Indium.

5. The apparatus of claim 4, wherein the bonding layer comprises Indium Gallium Phosphide (InGaP).

6. The apparatus of claim 1, the first semiconductor slab to include a first oxide layer, the second semiconductor slab to include a second oxide layer formed over the bonding layer, wherein the first and second semiconductor slabs are bonded at their oxide layers.

7. A method comprising:
   forming a bonding layer on a III-V semiconductor region, the bonding layer comprising a material with a refractive index of at least 2.0; and
   bonding a silicon semiconductor region to the III-V semiconductor region at the bonding layer, the III-V semiconductor region above and partially overlapping the silicon semiconductor region to create a lateral overlap region, wherein an optical waveguide is included in the lateral overlap region and comprises the silicon semiconductor material, the III-V semiconductor material and the bonding layer.

8. The method of claim 7, wherein forming the bonding layer comprises epitaxially depositing the material of the bonding layer on the III-V semiconductor region.

9. The method of claim 7, wherein the III-V material comprises Gallium Arsenide (GaAs).

10. The method of claim 9, wherein the bonding layer comprises a material including Indium.

11. The method of claim 10, wherein the bonding layer comprises Indium Gallium Phosphide (InGaP).

12. The method of claim 7, further comprising
   subjecting the III-V semiconductor region and the bonding layer to an oxygen plasma to form a first oxide layer; and
   subjecting the silicon semiconductor region to the oxygen plasma to form a second oxide layer;
   wherein bonding the silicon semiconductor region to the III-V semiconductor region at the bonding layer includes bonding the first and second oxide layers.

13. A system comprising:
   a light source;
   a modulator to receive light from the light source; and
   a transmission medium to operatively couple the light source and the modulator; wherein at least one of the light source and the modulator includes an optical device comprising a first semiconductor slab comprising a silicon material, a second semiconductor slab, comprising a III-V material, above and partially overlapping the first semiconductor slab to create a lateral overlap region, a bonding layer formed on the second semiconductor slab to enable the second semiconductor slab to be bonded to the first semiconductor slab at the lateral overlap region, and an optical waveguide included in the lateral overlap region and comprising the silicon semiconductor material, the III-V semiconductor material and the bonding layer, the bonding layer comprising a material with a refractive index of at least 2.0.

14. The system of claim 13, wherein the bonding layer is further comprises a material epitaxially deposited on the second semiconductor slab.

15. The system of claim 13, wherein the III-V material comprises Gallium Arsenide (GaAs).

16. The system of claim 15, wherein the bonding layer comprises a material including Indium.

17. The system of claim 16, wherein the bonding layer comprises Indium Gallium Phosphide (InGaP).

18. The system of claim 13, the first semiconductor slab to include a first oxide layer, the second semiconductor slab to include a second oxide layer formed over the bonding layer, wherein the first and second semiconductor slabs are bonded at their oxide layers.

* * * * *